(12) United States Patent
Planelle et al.

(10) Patent No.: US 7,422,441 B2
(45) Date of Patent: Sep. 9, 2008

(54) SEMICONDUCTOR COMPONENT AND DEVICE AND METHOD FOR CONNECTING SUCH A COMPONENT, PARTICULARLY FOR TEST PURPOSES

(75) Inventors: Philippe Planelle, La Tronche (FR); Graham Frearson, Bernin (FR); René Monnet, Vizille (FR); Jean-Luc Asmerian, Lumbin (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/764,708

(22) Filed: Jun. 18, 2007

(65) Prior Publication Data
US 2007/0298651 A1 Dec. 27, 2007

(30) Foreign Application Priority Data
Jun. 20, 2006 (FR) .................................. 06 05497

(51) Int. Cl.
*H01R 12/00* (2006.01)
(52) U.S. Cl. ........................................ 439/70; 439/482
(58) Field of Classification Search .................. 439/65, 439/66, 70, 71, 482, 912
See application file for complete search history.

(56) References Cited

U.S. PATENT DOCUMENTS 6,338,629 B1 1/2002 Fisher et al.
7,220,134 B2 * 5/2007 Goodman et al. ............. 439/70
7,248,481 B2 * 7/2007 Trobough .................... 361/785
2002/0145437 A1 10/2002 Sporck

FOREIGN PATENT DOCUMENTS

| JP | 0605990 | 2/1994 |
|---|---|---|
| JP | 2001099882 | 4/2001 |

OTHER PUBLICATIONS

Preliminary French Search Report, FR 06 05497, dated Feb. 21, 2007.

* cited by examiner

*Primary Examiner*—Khiem Nguyen
(74) *Attorney, Agent, or Firm*—Gardere Wynne Sewell LLP

(57) ABSTRACT

An electrical connection device includes a platform and a moving head. Between these components a semiconductor component is received and retained. The semiconductor component includes an electrical connection plate bearing an integrated circuit chip. The platform supports the making of electrical connection with front electrical connection terminals provided on a front panel of the electrical connection plate. The moving head bears a printed circuit board having interlinked pairs of contact terminals and associated pairs of electrical connection posts which make contact between the pairs of contact terminals of the printed circuit board and rear link terminals and rear transfer terminals provided on a rear panel of the electrical connection plate. The electrical connection plate includes circuitry which electrically connects the rear link terminals to the chip and also circuitry which electrically connects rear transfer terminals to front transfer terminals.

14 Claims, 3 Drawing Sheets

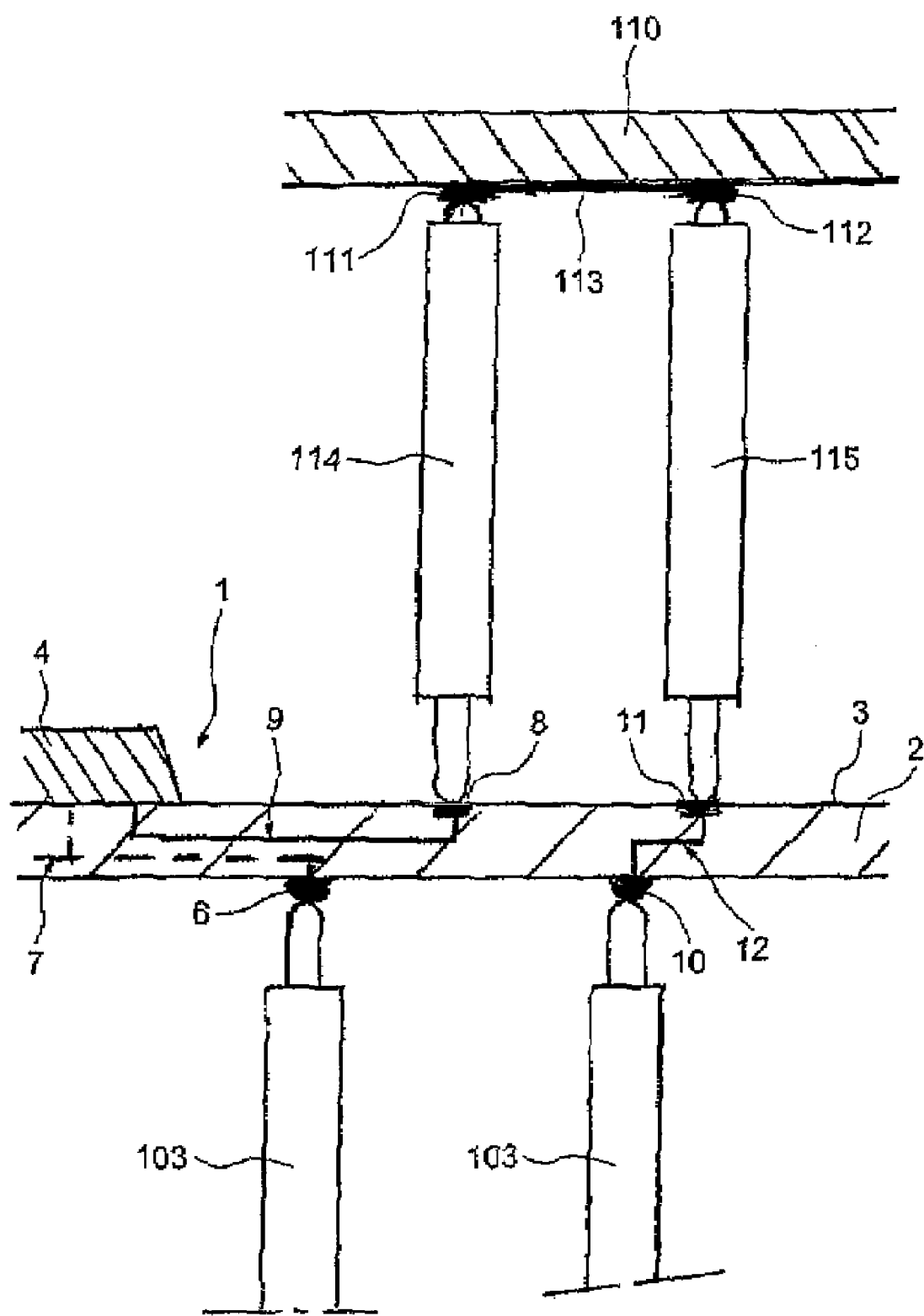

SEMICONDUCTOR COMPONENT AND DEVICE AND METHOD FOR CONNECTING SUCH A COMPONENT, PARTICULARLY FOR TEST PURPOSES

PRIORITY CLAIM

The present application is a translation of and claims priority from French Application for Patent No. 06 05497 of the same title filed Jun. 20, 2006, the disclosure of which is hereby incorporated by reference.

BACKGROUND OF THE INVENTION

1. Technical Field of the Invention

The present invention relates to the field of devices, methods and means for setting up electrical links between a semiconductor component comprising an electrical connection plate bearing an integrated circuit chip and in particular an electronic test rig.

2. Description of Related Art

The electrical connection devices commonly used to link to a semiconductor component to an electronic test rig comprise a platform and a moving head between which can be placed the semiconductor component. Said platform comprises electrical connection posts in contact with front electrical connection terminals provided on a front panel of said electrical connection plate, the latter having a network for electrically connecting these front terminals to the chip.

Currently, a semiconductor component is proposed, which has not only front terminals on a front panel of its electrical connection plate but also rear terminals on its rear panel, for setting up electrical connections for the chip from both sides of the electrical connection plate.

The electrical connection devices described above are not suited to such components with both front and rear terminals.

SUMMARY OF THE INVENTION

In accordance with an embodiment, an electrical connection device comprises a platform and a moving head between which can be placed a semiconductor component comprising an electrical connection plate bearing an integrated circuit chip, said platform comprising electrical connection means in contact with front electrical connection terminals provided on a front panel of said electrical connection plate.

Said head bears a printed circuit board having interlinked pairs of contact terminals and pairs of electrical connection posts coming into contact respectively on the one hand with the pairs of contact terminals of the printed circuit board and on the other hand with a rear link terminal and a rear transfer terminal provided on a rear panel of said electrical connection plate, the latter having means of electrically connecting the rear link terminals to said chip and means of electrically connecting the rear transfer terminals to front transfer terminals.

The front panel of said connection plate preferably has a multiplicity of front terminals linked to said chip and provided on an area and a multiplicity of front transfer terminals linked to rear transfer terminals and provided at the edge of said area.

Said head preferably comprises two detachable parts between which said printed circuit board is installed.

Said chip is preferably fixed to said rear panel of said electrical connection plate, said rear terminals being provided at the edge of said chip.

Another embodiment comprises a semiconductor component comprising an electrical connection plate bearing an integrated circuit chip.

Said electrical connection plate of said component has, on a rear panel, rear link terminals linked to said chip and rear transfer terminals and, on a front panel, front transfer terminals, and has means of electrically connecting the rear link terminals to said chip and means of electrically connecting the rear transfer terminals to the front transfer terminals.

The front panel of said connection plate of said component preferably has a multiplicity of front terminals linked to said chip and provided on an area and a multiplicity of front transfer terminals linked to rear transfer terminals and provided at the edge of said area.

Another embodiment comprises a method of electrically connecting a semiconductor component comprising an electrical connection plate bearing an integrated circuit chip.

This method comprises: producing a semiconductor component, the electrical connection plate of which has, on a rear panel, rear link terminals linked to said chip and rear transfer terminals and, on a front panel, front transfer terminals, and has means of electrically connecting the rear link terminals to said chip and means of electrically connecting the rear transfer terminals to the front transfer terminals; producing a printed circuit board having interlinked pairs of contact terminals; and linking the pairs of contact terminals of said printed circuit board respectively to the rear link terminals and to the rear transfer terminals.

Another embodiment comprises a method of testing a semiconductor component, comprising: implementing the abovementioned electrical connection device and/or the above method.

In another embodiment, a method is presented for testing an a semiconductor component comprising an electrical connection plate bearing an integrated circuit chip, the electrical connection plate including front terminals on a front side of the plate and rear terminals on a rear side of the plate, a first subset of the front terminals being electrically connected to a first subset of the rear terminals. The method comprises: making direct electrical test contact with a second subset of the front terminals, the second subset of front terminals being connected to the integrated circuit chip; and making indirect electrical test contact with a second subset of the rear terminals, the second subset of rear terminals being connected to the integrated circuit chip. The making of indirect electrical test contact comprises: making direct electrical test contact to the first subset of the front terminals, which are electrically connected to the first subset of the rear terminals, and making bridging electrical contact between the first subset of the rear terminals and the second subset of the rear terminals.

In yet another embodiment, an electrical connection device comprises: a test platform which receives a front side of an electrical connection plate bearing an integrated circuit chip, the test platform making direct electrical test contact to a first subset of front terminals on the front side of the electrical connection plate and making direct electrical test contact with a second subset of the front terminals also on the front side of the electrical connection plate. The first subset of the front terminals are electrically connected by the electrical connection plate to a first subset of rear terminals on a rear side of the electrical connection plate. A moving head mounts to the test platform to give indirect electrical test contact to a second subset of rear terminals on the rear side of the electrical connection plate and includes means for electrically interconnecting the first subset of the rear terminals and the second subset of rear terminals.

BRIEF DESCRIPTION OF THE DRAWINGS

Other advantages and features will become apparent by studying an electrical connection device of a test rig and its mode of use, linked to a semiconductor component, described by way of non-limiting examples and illustrated by the appended drawings in which:

FIG. 5 represents a partial enlarged view of the device of FIG. 4 showing the connections.

DETAILED DESCRIPTION OF THE DRAWINGS

Figure 1:
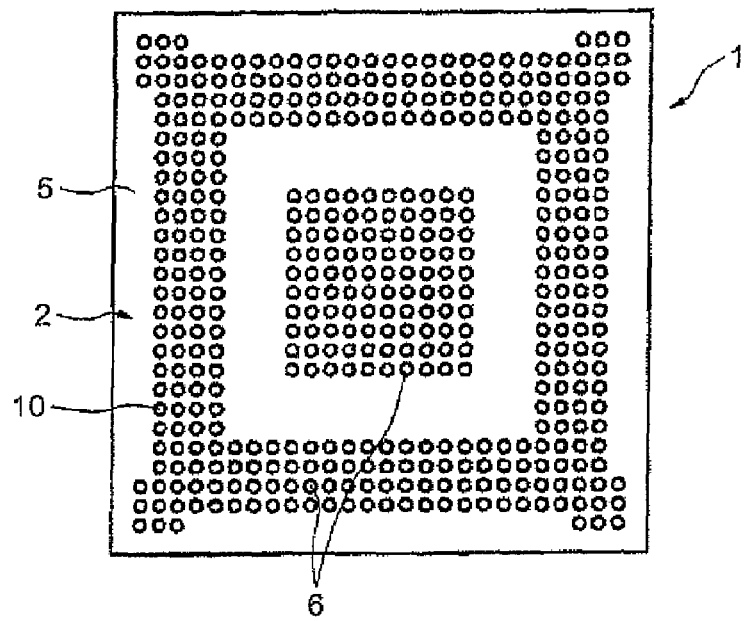
FIG. 1 represents a view of the front panel of a component.
Figure 2:
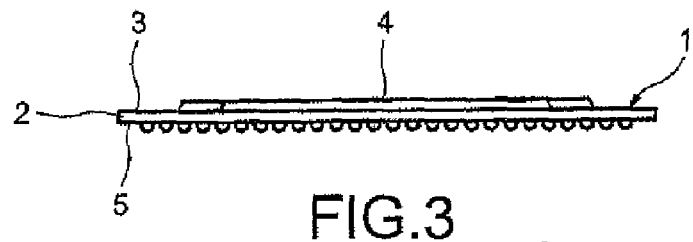
FIG. 2 represents a side view of said component.
Figure 3:
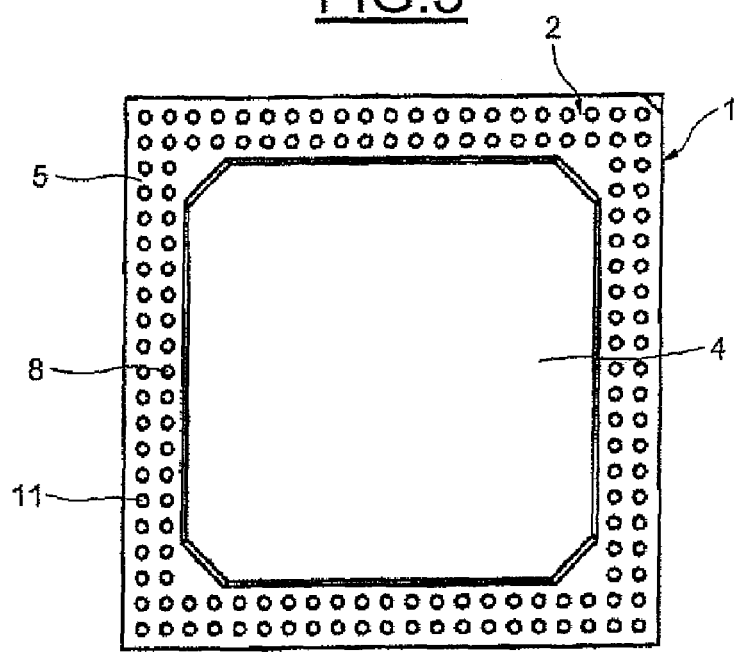
FIG. 3 represents a view of the rear panel of said component.

Referring in particular to FIGS. 1, 2, 3 and 5, it can be seen that a semiconductor component 1 is represented, comprising an electrical connection plate 2 which bears, in the middle of its rear panel 3, an integrated circuit chip 4.

On an area of its front panel 5, the electrical connection plate 2 has, in a manner known per se, a multiplicity of front electrical connection terminals 6, which are arranged, for example, in a matrix. The plate 2 comprises an electrical connection network 7 which selectively links the electrical connection terminals 6 to the chip 4.

On its peripheral part not covered by the chip 4, the electrical connection plate 2 has on its rear panel 3 a multiplicity of rear link terminals 8, which are arranged, according to one example, in rows. The plate 2 comprises an electrical connection network 2 which selectively links the link terminals 8 to the chip 4.

Furthermore, the electrical connection plate 2 has, on its front panel 5, a multiplicity of front transfer terminals 10 which are, according to one example, arranged around the edge of the area covered by said matrix and in rows, and has, on its rear panel 3, a multiplicity of rear transfer terminals 11 which are arranged, according to one example, in rows outside of the link terminals 8 and respectively adjacent to the latter. The plate 2 comprises an electrical connection network 12 which selectively links each front transfer terminal 10 to each rear transfer terminal 11.

Figure 4:
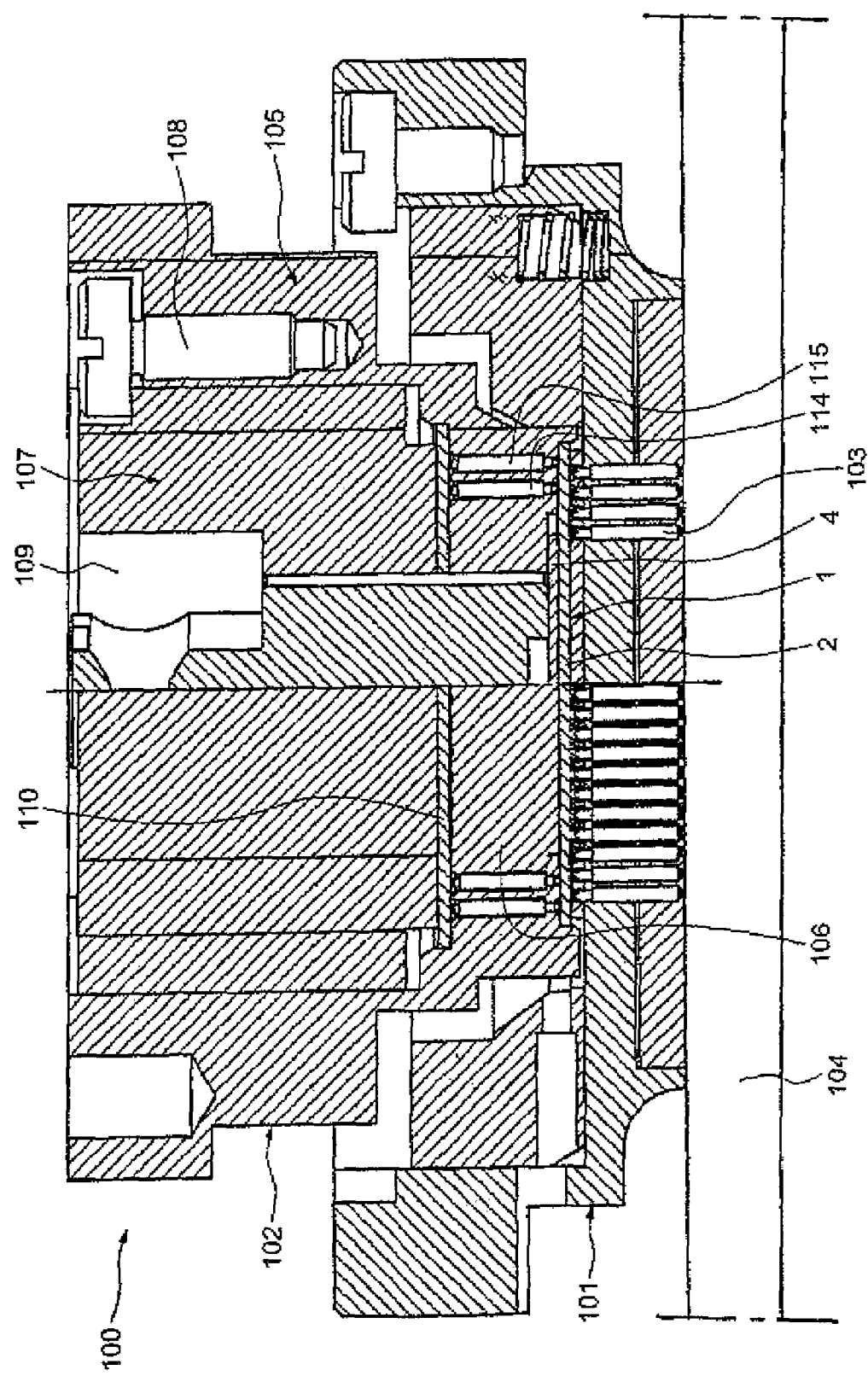
FIG. 4 represents a vertical cross section of an electrical connection device.

Referring to FIGS. 4 and 5, it can be seen that an electrical connection device 100 of a test rig is represented, comprising a horizontal platform 101 and a head 102 which moves vertically and is located above this platform 101. Such an electrical connection device is, as a general rule, known per se.

The horizontal platform 101 and the moving head 102 are adapted for the component 1 to be able to be installed between them so that its front panel 5 is on the side of the platform 101.

The horizontal platform 101 bears a multiplicity of vertical electrical connection posts 103 which pass through it vertically, and the top ends of which are elastically in contact with, respectively, the front electrical connection terminals 6 and the front transfer terminals 10.

The vertical posts 103, known per se, are telescopic and sprung so as to ensure elastic contact.

The horizontal platform 101 is associated with an electrical connection deck 104 positioned below, which comprises electrical connection means with which the bottom ends of the electrical connection posts 103 are in contact, this deck 104 being electrically linked to an electronic test rig not shown in the drawing.

The moving head 102 comprises a part 105 in the form of a cup, the bottom 106 of which is opposite the platform 101 and facing the connection plate 2, and a part 107 inserted in the cup 105 and fixed to the latter by screws 108.

The bottom 106 and the part 107 have a vertical passage 109.

The moving head 102 is borne by vertical displacement means and the vertical passage 109 is linked to depression means used to hold the component 1 and transport it to its described test position.

Between the bottom 106 and the part 105 and the part 107, there is an annular transfer printed circuit board 110, detachable and interchangeable, which has, on its bottom panel, a multiplicity of pairs of electrical connection terminals 111 and 112 respectively linked by tracks 113 and respectively arranged above the rear link terminals 8 and the rear transfer terminals 11 of the electrical connection plate 2 of the component 1.

The bottom 106 of the part 105 of the head 102 bears a multiplicity of vertical electrical connection posts 114 and 115 which pass through it vertically and which are interposed between the electrical connection plate 2 and the printed circuit board 110 in the following manner.

The top ends of the vertical posts 114 are in contact with the terminals 111 of the printed circuit board 110 and their bottom ends are in contact with the rear link terminals 8 of the electrical connection plate 2 of the component 1.

The bottom ends of the vertical posts 115 are in contact with the terminals 112 of the printed circuit board 110 and their bottom ends are in contact with the rear transfer terminals 11 of the electrical connection plate 2 of the component 1.

The vertical posts 114 and 115, known per se, are telescopic and sprung so as to ensure elastic contact.

The result of the above description is that the integrated circuit chip 4 can be electrically linked to the network of the electrical connection deck 104, linked to the abovementioned electronic test rig, by electrical connection posts 103 borne by the platform 101 and via, on the one hand, the electrical connection network 7 and the front electrical connection terminals 6 and via, on the other hand, the electrical connection network 9, the rear link terminals 8, the electrical connection posts 114, the link terminals 8, the pairs of electrical connection terminals 111 and 112 and the tracks 113 of the printed circuit board 110, the electrical connection posts 115, the rear transfer terminals 11, the electrical connection network 12 and the front transfer terminals 10.

The present invention is not limited to the example described above. Many variants of embodiment are possible without departing from the framework defined by the appended claims.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An electrical connection device comprising:
   a platform and a moving head between which can be placed a semiconductor component comprising an electrical connection plate bearing an integrated circuit chip;
   said platform comprising electrical connection means in contact with front electrical connection terminals provided on a front panel of said electrical connection plate;
   wherein said moving head bears a printed circuit board having interlinked pairs of contact terminals and pairs of electrical connection means for contacting respectively on the one hand with the pairs of contact terminals of the printed circuit board and on the other hand with one rear link terminal and one rear transfer terminal provided on a rear panel of said electrical connection plate, and wherein said electrical connection plate includes means for electrically connecting the rear link terminals to said chip and means for electrically connecting the rear transfer terminals to front transfer terminals.

2. The device according to claim 1, wherein the front panel of said connection plate has a multiplicity of front terminals linked to said chip and provided on an area and a multiplicity of front transfer terminals linked to rear transfer terminals and provided outside a peripheral edge of said area.

3. The device according to claim 1, wherein said head comprises two detachable parts between which said printed circuit board is installed.

4. The device according to claim 1, wherein said chip is fixed to said rear panel of said electrical connection plate, said rear terminals being provided outside a peripheral edge of said chip.

5. A method for testing a semiconductor component comprising an electrical connection plate bearing an integrated circuit chip, the electrical connection plate including front terminals on a front side of the plate and rear terminals on a rear side of the plate, a first subset of the front terminals being electrically connected to a first subset of the rear terminals, comprising:

making direct electrical test contact with a second subset of the front terminals, the second subset of front terminals being connected to the integrated circuit chip; and making indirect electrical test contact with a second subset of the rear terminals, the second subset of rear terminals being connected to the integrated circuit chip, the making of indirect electrical test contact comprising:

making direct electrical test contact to the first subset of the front terminals, which are electrically connected to the first subset of the rear terminals, and making bridging electrical contact between the first subset of the rear terminals and the second subset of the rear terminals.

6. The method of claim 5 wherein making direct electrical test contact to the first subset of the front terminals and making direct electrical test contact with the second subset of the front terminals comprises using a test platform which receives the front side of the electrical connection plate bearing an integrated circuit chip.

7. The method of claim 6 wherein making bridging electrical contact between first subset of the rear terminals and the second subset of the rear terminals comprises using a moving head which mounts to the test platform and includes means for electrically interconnecting the first subset of the rear terminals and the second subset of the rear terminals.

8. The method of claim 7 wherein the moving head, when mounted to the test platform, retains the electrical connection plate bearing an integrated circuit chip.

9. An electrical connection device comprising:

a test platform which receives a front side of an electrical connection plate bearing an integrated circuit chip, the test platform making direct electrical test contact to a first subset of front terminals on the front side of the electrical connection plate and making direct electrical test contact with a second subset of the front terminals also on the front side of the electrical connection plate;

wherein the first subset of the front terminals are electrically connected by the electrical connection plate to a first subset of rear terminals on a rear side of the electrical connection plate; and a moving head which mounts to the test platform to give indirect electrical test contact to a second subset of rear terminals on the rear side of the electrical connection plate and includes means for electrically interconnecting the first subset of the rear terminals and the second subset of rear terminals.

10. The device of claim 9 wherein the moving head, when mounted to the test platform, retains the electrical connection plate bearing an integrated circuit chip.

11. The device of claim 9, wherein said moving head comprises:

first and second detachable parts; and a printed circuit board installed between the first and second detachable parts, the printed circuit board including circuitry for supporting electrical interconnection of the first subset of the rear terminals and the second subset of rear terminals.

12. The device of claim 11 wherein the printed circuit board comprises electrically interlinked pairs of contact terminals, a first contact terminal in a pair being associated with a rear terminal in the first subset and a second contact terminal in that pair being associated with a rear terminal in the second subset.

13. The device of claim 12 wherein the first detachable part includes elastic contact members extending between the contact terminals and the first and second subsets of rear terminals.

14. The device of claim 9 wherein the test platform includes elastic contact members extending to make contact with the first and second subsets of front terminals.

* * * * *